United States Patent [19]

Ehlert et al.

[11] Patent Number: 4,788,627
[45] Date of Patent: Nov. 29, 1988

[54] HEAT SINK DEVICE USING COMPOSITE METAL ALLOY

[75] Inventors: Michael R. Ehlert, Beaverton; Earl R. Helderman, Hillsboro, both of Oreg.

[73] Assignee: Tektronix, Inc., Beaverton, Oreg.

[21] Appl. No.: 872,058

[22] Filed: Jun. 6, 1986

[51] Int. Cl.⁴ ............................................. H05K 7/20
[52] U.S. Cl. .................................. 361/386; 174/16.3; 357/81
[58] Field of Search .............. 174/16 HS; 361/386, 361/387, 388; 357/81; 219/167, 119; 165/185, 905; 420/428–432, 485, 488

[56] References Cited

U.S. PATENT DOCUMENTS

| | | | |
|---|---|---|---|
| 3,829,598 | 8/1974 | Darnell | 174/16 HS |
| 3,952,231 | 4/1976 | Davidson et al. | 174/16 HS |
| 3,989,923 | 11/1976 | Lees et al. | 219/119 X |
| 4,025,997 | 5/1977 | Gernitis et al. | 357/81 X |
| 4,227,036 | 10/1980 | Fitzgerald | 174/16 HS |
| 4,237,086 | 12/1980 | Gehle | 174/16 HS |
| 4,361,720 | 11/1982 | Resneau et al. | 174/16 HS |
| 4,366,361 | 12/1982 | Allen | 219/107 X |
| 4,401,728 | 8/1983 | Larker | 174/16 HS |
| 4,454,105 | 6/1984 | Wada et al. | 420/430 X |
| 4,601,879 | 7/1986 | Dür-Schnabel | 420/488 X |
| 4,604,328 | 8/1986 | Mizuhara | 420/488 X |
| 4,615,031 | 9/1986 | Eales et al. | 357/81 X |
| 4,626,282 | 12/1986 | Naya et al. | 420/429 X |

Primary Examiner—A. D. Pellinen
Assistant Examiner—A. Jonathan Wysocki
Attorney, Agent, or Firm—William S. Lovell; Jay K. Malkin

[57] ABSTRACT

The present invention involves a metal alloy heat sink containing tungsten, copper, and nickel. The heat sink is affixed to a ceramic substrate which supports one or more heat-generating electrical components. By adjusting the ratio of tungsten, copper, and nickel, substantial matching of the heat sink CTE with the substrate CTE is possible. Because the CTE of the heat sink is matched with that of the substrate, problems associated with differential thermal expansion are minimized, including micro-cracking and delamination. In addition, the completed heat sink has a relatively high thermal conductivity, and is capable of dissipating substantial amounts of heat.

9 Claims, 1 Drawing Sheet

HEAT SINK DEVICE USING COMPOSITE METAL ALLOY

BACKGROUND OF THE INVENTION

The present invention generally relates to devices for dissipating thermal energy from electronic components, and more particularly to a heat sink having the capacity to control differential thermal expansion in an electronic component system.

Modern electronic systems frequently use high-power hybrid circuitry containing numerous heat-generating components. For example, driver circuits for video display devices often contain substantial numbers of resistors, integrated circuits, and other semi-conductor components. These components generate varying amounts of heat during operation. In addition, heat load shifts occur from component to component, depending on the images displayed by the cathode ray tube of the device.

To dissipate heat from the above-described components, heat sinks are attached to the substrate on which the components are mounted. A heat sink is a device placed in physical contact with a heat-generating component to absorb and dissipate heat from the component.

Conventional heat sinks used in high-power hybrid circuitry are constructed of aluminum. Aluminum has a high thermal conductivity, which is desirable for a heat sink. Thermal conductivity is defined as the amount of heat per unit time that passes through a unit volume per degree of driving force. Thermal conductivity, as used herein, refers to values at the ordinary operating temperatures of the materials involved, typically between 20°–150° C. The thermal conductivity of aluminum within that temperature range is about 0.53 cal/cm-sec-° C.

As previously described, heat sinks are conventionally secured to the substrate on which the components are mounted. However, in high-power circuitry having multiple heat-generating sources, the use of a heat sink having a coefficient of thermal expansion (CTE) not matched with that of the substrate causes frequent problems. For a given material, CTE is a numerical value involving the change in size per degree change in temperature. CTE values for solid materials vary with temperature in a non-linear manner. They are traditionally expressed as a linear average of the CTE v. temperature curve for the temperature range in which the product is most likely to be used.

If the CTE of the heat sink and substrate are not properly matched, heat produced by the heat-generating components in the circuit will cause the heat sink and substrate to expand differentially. As a result, significant mechanical stress is generated, causing performance and reliability problems including micro-cracking of the substrate and/or components, delamination of the components, and other stress-related problems. These difficulties have been observed in systems using aluminum heat sinks and substrates manufactured of beryllia (BeO) or alumina (Al$_2$O$_3$). Aluminum has a relatively high CTE in comparison with BeO and Al$_2$O$_3$, as shown in Table I.

TABLE I

| Material | CTE (ppm/°C.) |
| --- | --- |
| Aluminum | 23.0 (20–100° C.) |

TABLE I-continued

| Material | CTE (ppm/°C.) |
| --- | --- |
| Beryllia | 7.5 (25–400° C.) |
| Alumina (96%) | 7.2 (25–400° C.) |

A need therefore exists for a heat dissipation device having a high thermal conductivity and a CTE substantially matched with the substrate to which it is secured. The present invention satisfies this need as described herein.

SUMMARY OF THE INVENTION

It is an object of the present invention to provide a heat dissipation device having a relatively high thermal conductivity.

It is another object of the present invention to provide a heat dissipation device which simultaneously solves the problems of heat removal and CTE mismatch.

It is a further object of the present invention to provide a heat dissipation device capable of operating effectively over wide temperature ranges.

It is a further object of the present invention to provide a heat dissipation device usable in a component package having a plurality of heat-producing components which generate shifting heat loads.

It is a still further object of the present invention to provide a heat dissipation device which prevents micro-cracking, delamination, and other problems associated with differential thermal expansion.

It is an even further object of the present invention to provide a heat dissipation device which is easy to manufacture, and uses low cost materials.

In accordance with the above objects, the present invention comprises a metal alloy heat sink containing tungsten, copper, and nickel. The heat sink is affixed to a ceramic substrate containing one or more heat-generating electrical components. By adjusting the ratio of tungsten, copper, and nickel, substantial matching of the heat sink CTE with the substrate CTE is possible. Because the heat sink CTE is matched with the substrate CTE, problems associated with differential thermal expansion are minimized, including micro-cracking and delamination. In addition, the completed heat sink has a relatively high thermal conductivity, and is capable of dissipating substantial amounts of heat.

These and other objects, advantages, and features of the present invention will become apparent to those of ordinary skill in the art in view of the detailed description and the drawing figures provided herein.

DETAILED DESCRIPTION OF A PREFERRED EMBODIMENT

The present invention represents an improved heat sink having desirable CTE and conductivity characteristics. The heat sink consists of a metal alloy containing 0–98% by weight tungsten, 0–98% by weight copper, and 0.1–5% by weight nickel. For commercial applications using beryllia or alumina substrates, the alloy will preferably contain 75-95% by weight tungsten, 3-23% by weight copper, and approximately 2% by weight nickel.

Numerous considerations were involved in selecting the above-described metallic components. As a general rule, most metals having a desirable thermal conductivity are characterized by an undesirably high degree of thermal expansion. Likewise, metals with a low CTE are usually poor thermal conductors. Tungsten has a relatively low thermal conductivity, but also has a low CTE. In contrast, copper has a high thermal conductivity and a high CTE. By combining these materials to form an alloy, the beneficially low CTE of tungsten and the high thermal conductivity of copper are incorporated in the present invention.

Nickel is added to the tungsten and copper as a metallic binder to improve the structural integrity of the final product, and to facilitate its manufacture, as discussed below. The amount of nickel may be varied within the above-described range as production and manufacturing conditions warrant.

CTE and conductivity values for tungsten, copper, and nickel are listed in Table II as follows:

TABLE II

| MATERIAL | CTE ppm/°C. | Thermal Conductivity Calorie/cm-sec °C. |
| --- | --- | --- |
| Tungsten | 4.6 (20–1000° C.) | 0.38 |
| Copper | 18.30 (20–500° C.) | 0.94 |
| Nickel | 15.0 (20–500° C.) | 0.198 |

Figure 2:
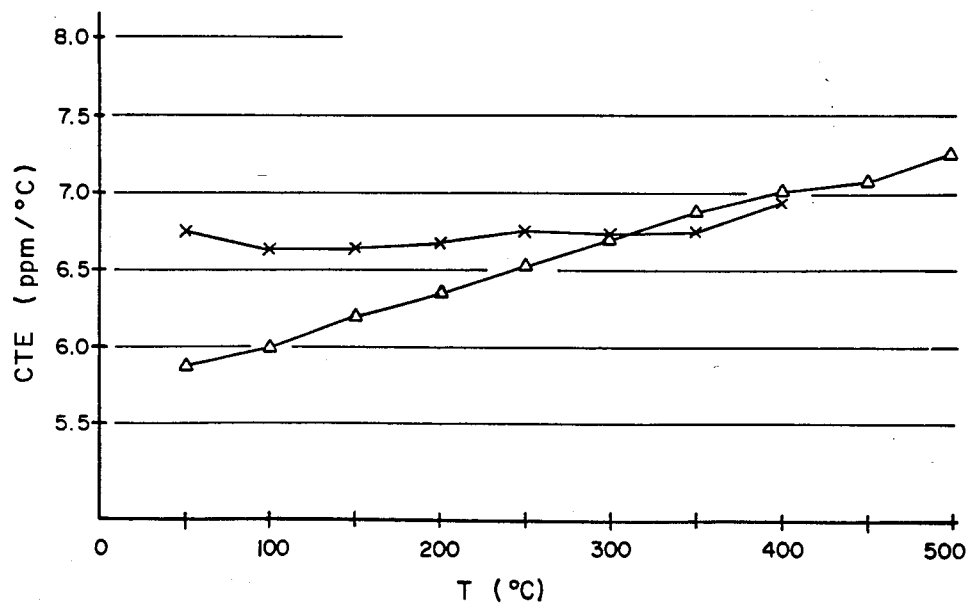
FIG. 2 is a graphic representation of the non-linear change in CTE v. temperature for an alumina substrate and a heat sink produced in accordance with the invention.

By adjusting the ratio of tungsten, copper, and nickel, substantial matching of the heat sink CTE with the substrate CTE is possible. As used herein, the term "matching" does not necessarily signify a substrate CTE equal to that of the heat sink CTE. Precise matching of CTE values is technically unfeasible since such values vary with temperature at different, non-linear rates. Matched CTE values at one temperature may be mismatched at another temperature. Table III and FIG. 2 show the relationship between CTE and temperature for a 96% alumina substrate and an alloy containing 89% by weight tungsten, 9% by weight copper, and 2% by weight nickel.

TABLE III

| Temperature °C. | CTE (ppm/°C.) Alloy (89% W, 9% Cu, 2% Ni) | CTE (ppm/°C.) Alumina (96%) |
| --- | --- | --- |
| 50 | 6.75 | 5.89 |
| 100 | 6.61 | 5.98 |
| 150 | 6.61 | 6.16 |
| 200 | 6.63 | 6.35 |
| 250 | 6.69 | 6.52 |
| 300 | 6.75 | 6.68 |
| 350 | 6.80 | 6.88 |
| 400 | 6.89 | 7.02 |
| 450 | — | 7.16 |
| 500 | — | 7.25 |

In view of the imprecise relationship between CTE and temperature, some engineering research must be done to select the proper alloy mixture for each different substrate involved. CTE selection involves numerous factors, including the operational temperature range of the heat-generating components, the relative thickness of the materials being used, the rate of heat load transfer between the components, and other factors, all of which can be experimentally determined under laboratory conditions. However, the examples described below discuss two alloys which may be used in connection with alumina and beryllia substrates to provide superior results over a broad temperature range.

EXAMPLE ALLOYS

As discussed above, two commonly used substrate materials in the electronics industry involve ceramic-based compositions consisting of beryllia or alumina. Two heat sink alloys have been formulated which offer high thermal conductivity and low differential thermal expansion when used with alumina and beryllia.

Alloy 1 contains 89% by weight tungsten, 9% by weight copper, and 2% by weight nickel, as indicated by the designation "89-9-2." Alloy 2 contains 80% by weight tungsten, 18% by weight copper, and 2% by weight nickel, likewise indicated by the designation "80-18-2." Table IV below lists CTE and conductivity values for alloys 1 and 2 in comparison with BeO and $Al_2O_3$. Both alloys 1 and 2 can be used with BeO and $Al_2O_3$ substrates, although the precise matching of alloy to substrate will depend on the above-described factors.

TABLE IV

| MATERIAL | CTE (ppm/°C.) | Thermal Conductivity Calorie/cm-sec °C. |
| --- | --- | --- |
| BeO | 7.5 (25–400° C.) | 0.60 |
| 96% Alumina | 7.2 (25–400° C.) | 0.05 |
| Alloy 1 (89-9-2) | 6.97 (25–350° C.) | 0.470 |
| Alloy 2 (80-18-2) | 8.67 (25–350° C.) | 0.55 |

Alloys 1 and 2 have proven effective in avoiding mechanical stress in systems using integrated circuits and resistors operating at temperatures of up to 125° C. and 150° C., respectively. In addition, the alloys were able to operate under storage conditions of between −40° C. and 150° C.

Synthesis

To prepare the above-described alloys, blue tungsten oxide ($W_2O_5$), black nickel oxide (NiO), and black copper oxide (CuO) are first combined and co-reduced. The terms "blue" and "black" are standard terms referring to color characteristics of the oxides being used. Co-reduction involves heating in a hydrogen atmosphere at temperatures between 400°–900° C. over a 1–4 hour period. As a result, the oxides are reduced to elemental metal, and water is produced. The resulting metal powders may be formed in near-net shape (approximately the same size as will be actually used), or any other shape desired.

Next, the metals are sintered in a hydrogen atmosphere at an approximate temperature of 1200°–1500° over a period of time ranging from 15 minutes to 2 hours. Sintering involves the agglomeration of metal powders at high temperatures. Sintering increases the strength, conductivity, and density of the final product. Nickel aids in the sintering process by alloying with the copper, lowering the matrix melting point of the metal combination, and promoting wetting of the tungsten.

It may also be possible to prepare the above-described alloys using elemental metal powders instead of oxides. Should powders be used, co-reduction would not be necessary.

The final product may range in thickness, usually from a few thousandths of an inch to one inch. For most purposes, a 0.25 inch thickness is effective. However, the thickness of the product depends on its ultimate use, the heat-generating components involved, cost factors, and mechanical strength requirements.

Incorporation of the Invention in a Circuit Package

Figure 1:
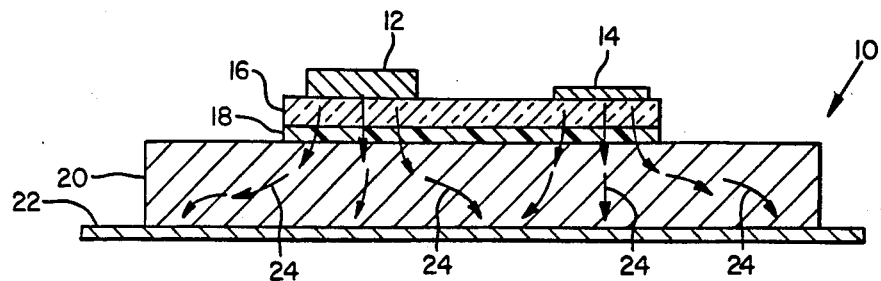
FIG. 1 represents a completed circuit package incorporating a heat sink manufactured in accordance with the present invention.

FIG. 1 represents an exemplary completed circuit package 10 incorporating the invention. The circuit package 10 includes an integrated circuit 12, a resistor 14, a ceramic substrate 16, an epoxy layer 18, a heat sink 20, and an optional cold plate 22.

The integrated circuit 12 and resistor 14 are attached to the substrate 16 using conventional means. The substrate 16 is preferably attached to the heat sink 20 using an epoxy resin adhesive known in the art. However, the substrate 16 may be soldered or brazed to the heat sink 20. If epoxy is used, the assembly temperature will be between 100°-200° C. to permit proper curing of the adhesive. If soldering is used, assembly temperatures will range from 200° C. to 600° C. Brazing temperatures are traditionally below about 1100° C.

If desired, an optional cold plate 22 may be secured to the heat sink 20. The cold plate 22 permits further heat dissipation, and may consist of a flat metal sheet with a plurality of outwardly directed fins, or a metal assembly having conduits therein for receiving cooling water.

Depending on the composition of the heat sink, the substrate involved, and the instrument in which these components are used, it may be possible to further improve the stress characteristics of the circuit package by imposing an ambient temperature compressive pre-load on the substrate. To accomplish this, a heat sink is prepared having a CTE slightly higher than that of the substrate. The substrate and heat sink are then bonded together, during which both materials are heated. Because of the slightly greater CTE of the heat sink, it will expand more than the substrate at the uniform temperatures applied during bonding. As a result, during the cooling stage after bonding, the heat sink will contract to a greater degree than the substrate, thereby compressing the substrate.

This technique is useful in situations where a decreasing heat gradient exists in the circuit package. In such situations, temperature levels progressively decrease as the distance from the heat-generating device increases. This directional decrease in temperature is illustrated by arrows 24 in FIG. 1. By applying a compressive pre-load to the substrate, which receives more heat than the heat sink, such pre-load will compensate for the additional heat received by the substrate and additional expansion thereof. As a result, the thermal expansion of the substrate and heat sink will be substantially matched at operating temperature levels.

In laboratory tests, a compressive pre-load was generated in a circuit package by using a heat sink containing 80% by weight tungsten, 18% by weight copper, and 2% by weight nickel, i.e., alloy 2 described above. The completed heat sink had a CTE of 8.0 ppm/° C. in a temperature range of 25°-125° C., and was affixed to a 96% alumina substrate having a CTE of 6.0 ppm/° C. (at 25°-125° C.). The two components were bonded together using epoxy adhesive at 140° C. The resulting product, after cooling, had a compressive pre-load at ambient temperature levels.

Having now fully described the invention, it will be apparent to one of ordinary skill in the art that many changes and modifications can be made thereto without departing from the spirit or scope of the invention as set forth herein. Various operating, production, and composition parameters of the invention may be modified, depending on the purposes for which it is used.

For example, palladium, silver, gold, cobalt, iron, or mixtures thereof may entirely or partially replace the nickel used in the invention. Although Pd, Ag and Au have excellent conductive characteristics, the cost of these materials may be prohibitive. In addition, it may be possible to substitute molybdenum for tungsten in the alloy. Although molybdenum has a lower conductivity than tungsten, molybdenum is lighter in weight. The use of molybdenum is desirable when weight considerations are important.

Under certain circumstances, tungsten may be completely omitted where a substrate of very high CTE is involved. This would result in a heat sink with a correspondingly high CTE. The omission of tungsten may also be appropriate in systems where very high operatoonal temperatures exist. Likewise, copper may be omitted when a low CTE substrate is used, when the circuit operates at very low temperatures, or when a low CTE semiconductor (i.e., a silicon integrated circuit) is directly attached to the heat sink.

Regardless of form, the present invention represents an advance in component packaging technology. The ability to match the CTE of the heat sink with that of its associated substrate provides numerous benefits in comparison to systems using fixed CTE heat sink materials. CTE matching is especially important in electronic systems using high power circuitry, for the reasons described above.

It is therefore intended that the invention be defined only by the following claims:

We claim:

1. A heat sink consisting essentially of about 75-95% by weight tungsten, about 3-23% by weight copper, and about 2% by weight nickel.

2. A component package comprising:
   at least one semi-conductor device;
   a substrate having said semi-conductor device affixed thereto; and
   a heat sink affixed to said substrate, said heat sink consisting essentially of about 75-95% by weight tungsten, about 3-23% by weight copper, and about 2% by weight nickel.

3. A method for manufacturing an electrical component package comprising the steps of:
   securing at least one semi-conductor device to a substrate;
   obtaining the coefficient of thermal expansion for said substrate;
   combining about 0-98% by weight of a metal selected from the group consisting of tungsten and molybdenum, about 0-98% by weight copper, and about 0.1-5% by weight metallic binder in proportions sufficient to form a heat sink having a coefficient of thermal expansion substantially matched with that of said substrate; and
   securing said substrate to said heat sink.

4. The method of claim 3 wherein said metallic is selected from the group consisting of nickel, palladium, silver, gold, cobalt, iron, and mixtures thereof.

5. The method of claim 3 wherein said substrate comprises a ceramic member manufactured from a material selected from the group consisting of alumina and beryllia.

6. The method of claim 3 wherein said semi-conductor device, substrate, and heat sink are secured together using an epoxy resin adhesive.

7. The method of claim 3 further comprising the steps of:
- heating said substrate and said heat sink during said securing of said substrate to said heat sink; and
- cooling said substrate and said heat sink after said heating, said heat sink contracting to a greater degree than said substrate during said cooling so as to enable said heat sink to exert compressive force on said substrate, whereby said substrate remains in a compressed condition at ambient temperature levels.

8. A method for manufacturing an electrical component package comprising:
- securing at least one semi-conductor device to a substrate; and
- securing said substrate to a heat sink, said heat sink consisting essentially of about 75-95% by weight tungsten, about 3-23% by weight copper, and about 2% by weight nickel.

9. The method of claim 8 further comprising the steps of:
- heating said substrate and said heat sink during said securing of said substrate to said heat sink; and
- cooling said substrate and said heat sink after said heating, said heat sink contracting to a greater degree than said substrate during said cooling so as to enable said heat sink to exert compressive force on said substrate, whereby said substrate remains in a compressed condition at ambient temperature levels.

* * * * *